United States Patent
Feldner et al.

(10) Patent No.: US 10,547,131 B2
(45) Date of Patent: Jan. 28, 2020

(54) ELECTRICAL CONNECTION APPARATUS WITH IMPROVED THERMAL COUPLING OF A PRINTED CIRCUIT BOARD WHICH HAS A TEMPERATURE SENSOR

(71) Applicant: PHOENIX CONTACT E-MOBILITY GMBH, Schieder-Schwalenberg (DE)

(72) Inventors: Ralf Feldner, Detmold (DE); Carsten Garth, Lemgo (DE); Tanja Gebhardt, Schlangen (DE)

(73) Assignee: PHOENIX CONTACT E-MOBILITY GMBH, Schieder-Schwalenberg (DE)

( * ) Notice: Subject to any disclaimer, the term of this patent is extended or adjusted under 35 U.S.C. 154(b) by 0 days.

(21) Appl. No.: 16/313,573

(22) PCT Filed: Jun. 13, 2017

(86) PCT No.: PCT/EP2017/064373
§ 371 (c)(1),
(2) Date: Dec. 27, 2018

(87) PCT Pub. No.: WO2018/001719
PCT Pub. Date: Jan. 4, 2018

(65) Prior Publication Data
US 2019/0260146 A1  Aug. 22, 2019

(30) Foreign Application Priority Data
Jun. 30, 2016  (DE) .................. 10 2016 211 876

(51) Int. Cl.
*H01R 12/71* (2011.01)
*H01R 27/02* (2006.01)
(Continued)

(52) U.S. Cl.
CPC ......... *H01R 12/714* (2013.01); *H01R 13/502* (2013.01); *H01R 13/6683* (2013.01);
(Continued)

(58) Field of Classification Search
CPC ............. H01R 12/716; H01R 2201/20; H01R 13/2421; H01R 13/2428
(Continued)

(56) References Cited

U.S. PATENT DOCUMENTS

| 5,181,859 A | 1/1993 | Foreman et al. |
| 2015/0171568 A1 | 6/2015 | Kawamoto et al. |
| 2016/0039297 A1* | 2/2016 | Kretschmer ........ B60L 11/1818 320/109 |

FOREIGN PATENT DOCUMENTS

| DE | 29901984 U1 | 2/1998 |
| DE | 102009034886 A1 | 2/2011 |

(Continued)

OTHER PUBLICATIONS

International Search Report, dated Jul. 20, 2017 (3 pages).

*Primary Examiner* — Abdullah A Riyami
*Assistant Examiner* — Justin M Kratt
(74) *Attorney, Agent, or Firm* — Occhiuti & Rohlicek LLP (57) ABSTRACT

Disclosed is an electrical connection apparatus for coupling to a corresponding connecting device and for transmitting electrical energy. The electrical connection apparatus includes at least one power contact arranged in a housing of the apparatus and connected to the housing, and at least one temperature sensor for determining a temperature of the power contact. The apparatus further includes a printed circuit board arranged in the housing of the electrical connection apparatus between the power contact and a retaining section of the housing, with the printed circuit board being clamped between the power contact and the retaining section by means of a spring-force apparatus arranged between the power contact and the retaining section. The printed circuit board is thermally coupled to the (Continued)

power contact directly or by means of the spring-force apparatus. The at least one temperature sensor is arranged on the printed circuit board.

14 Claims, 5 Drawing Sheets

(51) Int. Cl.
*H01R 13/66* (2006.01)
*H01R 13/502* (2006.01)
*H05K 1/11* (2006.01)
*B60L 53/16* (2019.01)
*H01R 13/24* (2006.01)

(52) U.S. Cl.
CPC .............. *H01R 27/02* (2013.01); *H05K 1/119* (2013.01); *B60L 53/16* (2019.02); *B60Y 2200/91* (2013.01); *B60Y 2300/91* (2013.01); *H01R 12/716* (2013.01); *H01R 13/2421* (2013.01); *H01R 13/2428* (2013.01); *H01R 2201/20* (2013.01); *H01R 2201/26* (2013.01); *H05K 2201/09072* (2013.01); *H05K 2201/10151* (2013.01); *H05K 2201/10265* (2013.01)

(58) Field of Classification Search
USPC .......................... 439/76.1, 66, 913, 824, 700
See application file for complete search history.

(56) References Cited

FOREIGN PATENT DOCUMENTS

| | | |
|---|---|---|
| DE | 102012105774 B3 | 10/2013 |
| DE | 102013110548 A1 | 3/2015 |
| DE | 102014111334 A1 | 2/2016 |
| WO | WO 2015044068 | 4/2015 |

* cited by examiner

ELECTRICAL CONNECTION APPARATUS WITH IMPROVED THERMAL COUPLING OF A PRINTED CIRCUIT BOARD WHICH HAS A TEMPERATURE SENSOR

CROSS-REFERENCE TO RELATED APPLICATIONS

This application is the national stage under 35 USC 371 of international application PCT/EP2017/064373, filed on Jun. 13, 2017, which claims the benefit of the Jun. 30, 2016 priority date of German application DE 10 2016 211 876.5.

The present invention relates to an electrical connection apparatus for coupling to a corresponding connecting device and for transmitting electrical energy. The present invention further relates to a charging station for delivering electrical energy to a receiver of electrical energy.

Electrical connection apparatuses in the form of plug connectors or charging plugs for electrically drivable vehicles are known from the prior art, which are designed for connection to a corresponding connecting device in the form of a socket. In relation to this, reference is made to the charging plug disclosed in DE 10 2012 105 774 B3. Power contacts are arranged in the charging plug, each having a first connection region and a second connection region. The first connection region is in the form of a contact socket and is suitable for galvanic connection to a contact pin, the contact pin being galvanically connected to an electrical energy receiver, e.g. a battery of a vehicle. However, there is also a possible configuration in which a contact socket is connected to the battery, in which case the first connection region is then in the form of a contact pin. The second connection region of the power contact is designed for galvanic connection to an electrical energy source, e.g. a charging station or to an electrical supply grid in general. To this end, the second connection region is firmly connected to a charging cable.

As a result of a charging current flowing through the power contact, the power contact inevitably heats up as a result of ohmic losses. However, the heating of the power contact is limited to a maximum temperature rise. According to the standard IEC 62196-3, for example, the maximum temperature rise is limited to 50K. This in turn leads to a maximum charging current of up to 200 A continuous load for plug connector geometries which are, for the most part, standardized.

In the case of intermittent recharging of a battery, on the other hand, higher charging currents of 350 A and more are needed for limited periods in order to recharge the battery in a desired short period of time. This in turn leads to a temporary heating of the power contacts which exceeds the maximum temperature rise.

To avoid overheating the plug connectors, it is known from the prior art to provide plug connectors with temperature sensors. These temperature sensors monitor the temperature of the plug connector. As soon as the temperature exceeds a defined limit value, the charging operation is interrupted or the charging current is reduced by means of monitoring electronics.

DE 10 2009 034 886 A1 describes a plugging device for a charging cable for connecting an electric vehicle to a charging station. This plugging device comprises a housing and electrical contacts associated with the housing for connection to a connection apparatus in the charging station or in the electric vehicle. A temperature detecting means in the form of a thermistor is also provided in the housing, it being possible for the temperature in the housing to be evaluated via the temperature detecting means.

For reasons relating to production technology and in order to integrate or combine multiple functionalities, it is desirable to provide in the electrical connection apparatus a printed circuit board which is thermally, and optionally also electrically, connected to at least one power contact and preferably to multiple power contacts. However, because of thickness tolerances of the printed circuit boards that are to be installed, it is not always reliably possible to provide a thermal coupling and optionally an electrical connection of a printed circuit board to the power contacts, in particular if a printed circuit board is oriented perpendicularly to a plug-in direction of the electrical connection apparatus, i.e. if a surface normal of the printed circuit board is oriented parallel to a plug-in direction of the electrical connection apparatus and thus parallel to a longitudinal axis of the power contact.

The object underlying the invention is to provide an electrical connection apparatus in which a reliable thermal coupling of the printed circuit board to at least one power contact is ensured.

The object underlying the present invention is achieved by an electrical connection apparatus having the features of claim 1. Advantageous embodiments of the electrical connection apparatus are described in the claims that are dependent on claim 1.

More precisely, the underlying the present invention is achieved by an electrical connection apparatus for coupling to a corresponding connecting device and for transmitting electrical energy, wherein the electrical connection apparatus has at least one power contact which is arranged in a housing of the electrical connection apparatus and is connected to said housing and at least one temperature sensor for determining a temperature of the power contact. The electrical connection apparatus according to the invention is characterized in that it has a printed circuit board which is arranged in the housing of said electrical connection apparatus and is arranged between the power contact and a retaining section of the housing, wherein the printed circuit board is clamped between the power contact and the retaining section by means of a spring-force apparatus which is arranged between the power contact and the retaining section. The printed circuit board is thermally coupled to the power contact directly or by means of the spring-force apparatus, and the at least one temperature sensor is arranged on the printed circuit board.

With the electrical connection apparatus according to the invention, a reliable contact of the printed circuit board with the power contact is ensured either directly or by the intermediary of the spring-force apparatus. Thus, thickness tolerances of the printed circuit boards that are to be installed can be reliably compensated. Furthermore, the assembly of the electrical connection apparatus according to the invention is simplified, since the printed circuit board can be float mounted in the electrical connection apparatus so that it is not necessary to set such high standards for the positioning of the printed circuit board within the electrical connection apparatus while at the same time a reliable contacting of the printed circuit board remains ensured.

The electrical connection apparatus can be in the form of a charging plug and/or a charging socket. If the electrical connection apparatus is in the form of a charging plug, the housing of the electrical connection apparatus is in the form of a charging-plug housing. If the electrical connection apparatus is in the form of a charging socket, the housing of the electrical connection apparatus is in the form of a charging-socket housing.

The mechanical coupling of the printed circuit board to the power contact means that either the spring-force apparatus is in direct contact with the power contact or the printed circuit board itself is in direct contact with the power contact.

The spring-force apparatus is preferably in the form of a bent metal strip. For example, the spring-force apparatus can be formed of spring steel. In cross-section, the spring-force apparatus can be e.g. U-shaped or S-shaped.

The spring-force apparatus can apply force to the power contact in a direction parallel to a longitudinal axis of the power contact and/or a direction radial to the longitudinal axis of the power contact.

If the charging plug comprises more than one temperature sensor, all the temperature sensors can of course be arranged on the printed circuit board.

Preferably, the electrical connection apparatus is designed such that the printed circuit board is galvanically connected to the power contact directly or by means of the spring-force apparatus.

The correspondingly designed electrical connection apparatus has a yet further improved thermal coupling between the printed circuit board and the power contact. Furthermore, the correspondingly designed electrical connection apparatus has the advantage that, owing to the galvanic connection of the printed circuit board to the power contact, the power contact can be e.g. resistance coded by means of the printed circuit board. Furthermore, information can be exchanged between the printed circuit board and the power contact.

Preferably, the electrical connection apparatus is designed such that the printed circuit board has an electrically conductive contact surface which is galvanically connected to the power contact directly or by means of the spring-force apparatus.

In this case, the electrically conductive contact surface is preferably made of a metal or has at least one metallic constituent.

Further preferably, the electrical connection apparatus is designed such that the spring-force apparatus is in the form of a surface-mounted spring-force apparatus and is soldered to the contact surface.

A correspondingly designed electrical connection apparatus has a further simplified assembly, since the spring-force apparatus is firmly connected to the printed circuit board and so the spring-force apparatus does not have to be positioned separately when assembling the electrical connection apparatus. Furthermore, in the correspondingly designed electrical connection apparatus a reliable connection—both mechanical and galvanic—of the spring-force apparatus to the printed circuit board is always ensured.

The surface-mounted spring-force apparatus can also be referred to as an SMD spring-force apparatus. SMD here stands for surface-mount device. The spring-force apparatus is soldered directly on to the contact surface of the printed circuit board. The associated technology is referred to as surface mounting.

According to an advantageous embodiment, the electrical connection apparatus is designed such that the printed circuit board has a through hole through which the power contact protrudes and the contact surface of the printed circuit board surrounds the through hole thereof.

The correspondingly designed electrical connection apparatus has further improved assembly properties, since a radial positioning of the printed circuit board, i.e. a positioning perpendicular to a plug-in direction of the electrical connection apparatus, takes place via the power contact(s).

The power contact has a first connection region for galvanic connection to an electrical energy receiver or energy transmitter and a second connection region for galvanic connection to a charging cable. Preferably, the first connection region of the power contact protrudes through the through hole of the printed circuit board.

According to a further advantageous embodiment, the electrical connection apparatus is designed such that the spring-force apparatus is arranged between the power contact and the printed circuit board and galvanically connected to the power contact and the printed circuit board, wherein the printed circuit board is clamped against the retaining section by means of the spring-force apparatus.

The spring-force apparatus is therefore electrically conductive. For example, the spring-force apparatus can be formed of a steel, preferably a spring steel. Force is therefore applied to the printed circuit board by means of the spring-force apparatus in the direction of the retaining section.

Further preferably, the electrical connection apparatus is designed such that the power contact has a securing flange by means of which the power contact is connected to the charging plug housing, the securing flange extending radially away from a longitudinal axis of the power contact.

Further preferably, the electrical connection apparatus is designed such that the spring-force apparatus is arranged between the securing flange and the retaining section of the housing.

As a result of a corresponding design of the electrical connection apparatus, both a mechanical and a galvanic contacting of the power contact are reliably achieved either directly by the printed circuit board or by the spring-force apparatus.

According to an advantageous embodiment of the electrical connection apparatus, the printed circuit board is used for the resistance coding of the power contact.

In the correspondingly designed electrical connection apparatus, various functionalities, namely the resistance coding of the power contact and the temperature determination of the power contact, are executed by a single component, namely the printed circuit board. Thus, the correspondingly designed electrical connection apparatus has fewer parts, resulting in both reduced production costs and reduced assembly complexity.

The resistance coding can take place via a coding means arranged on the printed circuit board for the value of the current intensity that can be transmitted through the charging cable. The coding means can in particular be in the form of an ohmic resistor.

A charging cable employed by the vehicle user has a certain copper cross-section of its cable lines, which defines the maximum allowable electric current intensity that can flow via the charging cable. For coding, i.e. setting this value the charging cable has an ohmic resistor in the region of at least one of its two plugs, the nominal value of which is clearly associated with the allowable current intensity. Each nominal current intensity value allowed for a charging cable in each case, e.g. 16 A, 32 A or 63 A, has a particular ohmic resistor value corresponding thereto.

According to a further advantageous embodiment of the electrical connection apparatus, a surface normal of the printed circuit board is oriented substantially parallel to a longitudinal axis of the power contact.

The correspondingly designed electrical connection apparatus has advantageous assembly properties. Furthermore, a reliable contacting—both mechanical and galvanic—is achieved between the power contact and the printed circuit board or spring-force apparatus.

The feature according to which the surface normal is oriented parallel to the longitudinal axis of the power contact results in the orientation of the surface normal of the printed circuit board parallel to a plug-in direction of the electrical connection apparatus. The electrical connection apparatus is mechanically and electrically coupled to the connecting device by insertion in the plug-in direction.

Further preferably, the electrical connection apparatus is designed such that the housing has a front region and a back region which can be connected thereto, the power contact being arranged in and connected to the back region, the retaining section of the housing being arranged in the front region and the printed circuit board being arranged between the back region and the front region.

The correspondingly designed electrical connection apparatus is particularly simple to assemble.

Preferably, the electrical connection apparatus is designed such that the temperature sensor is a temperature-dependent electrical resistor, in particular a thermistor.

Alternatively, the temperature sensor can also be in the form of an NTC resistor (NTC thermistor), a PTC resistor (PTC thermistor) or a KTY sensor.

The object on which the present invention is based is further achieved by a charging station for delivering electrical energy to a receiver of electrical energy, the charging station having an electrical connection apparatus in the form of a charging plug as described above, which is electrically connected to the charging station by means of a supply cable.

Further advantages, details and features of the invention can be taken from the exemplary embodiments explained below. In detail, the figures show the following.

In the description that now follows, the same reference signs refer to the same components or features, so that a description relating to a part provided in relation to one figure also applies to the other figures to avoid repetition of a description. Furthermore, individual features that have been described in connection with one embodiment can also be used separately in other embodiments.

Figures 1A, 1B:
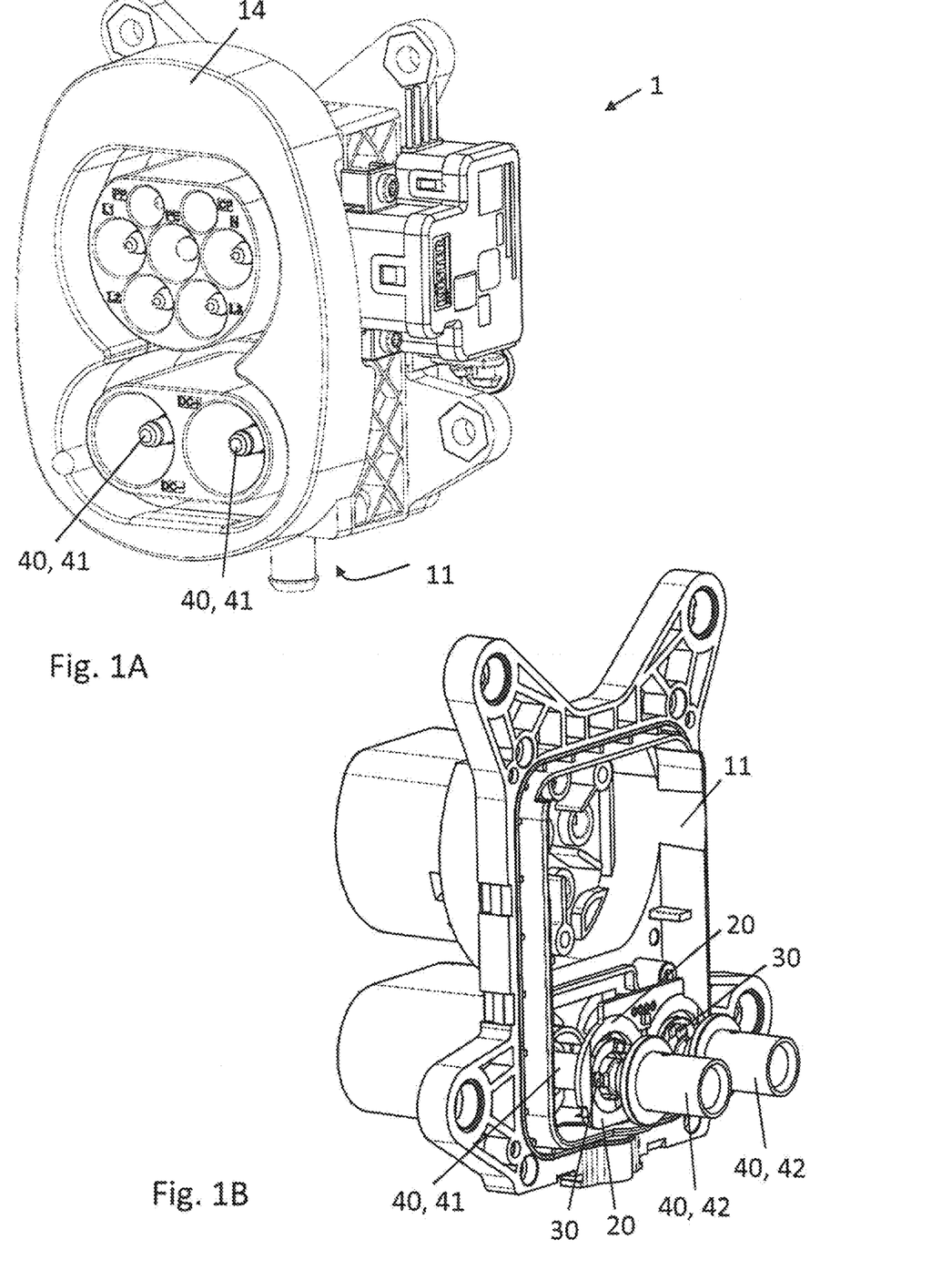
FIG. 1A: a perspective illustration of an electrical connection apparatus according to the invention in the form of a charging plug viewed obliquely from the front with a disassembled back region.
FIG. 1B: a perspective illustration of the front region of the charging plug illustrated in FIG. 1A.

In FIGS. 1A and 1B, an electrical connection apparatus 1 according to the invention is illustrated, which is in the form of a charging plug 1 in the exemplary embodiment illustrated. The charging plug 1 is designed for coupling to a corresponding connecting device and for transmitting electrical energy. A corresponding connecting device can be e.g. a charging socket of a motor vehicle (not illustrated in the figures), which is connected to a battery.

Figure 4A:
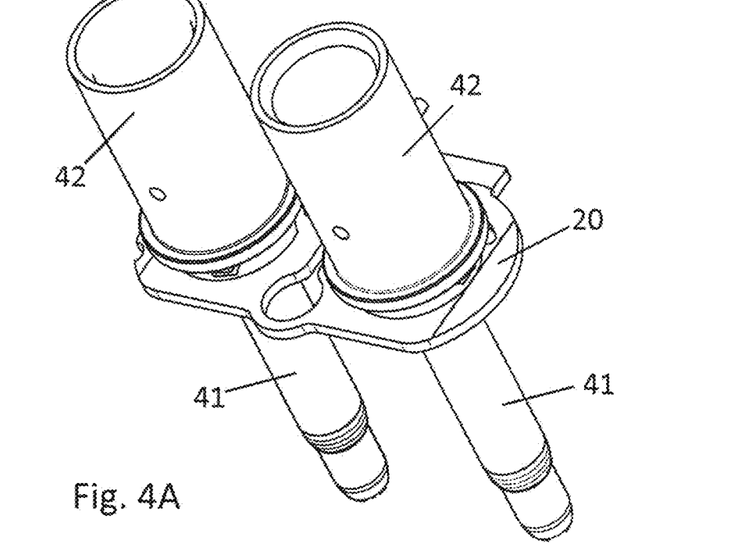
FIG. 4A: a cross-sectional illustration of two power contacts with a printed circuit board of the charging plug according to the invention coupled to both contacts in a perspective illustration.
Figure 4B:
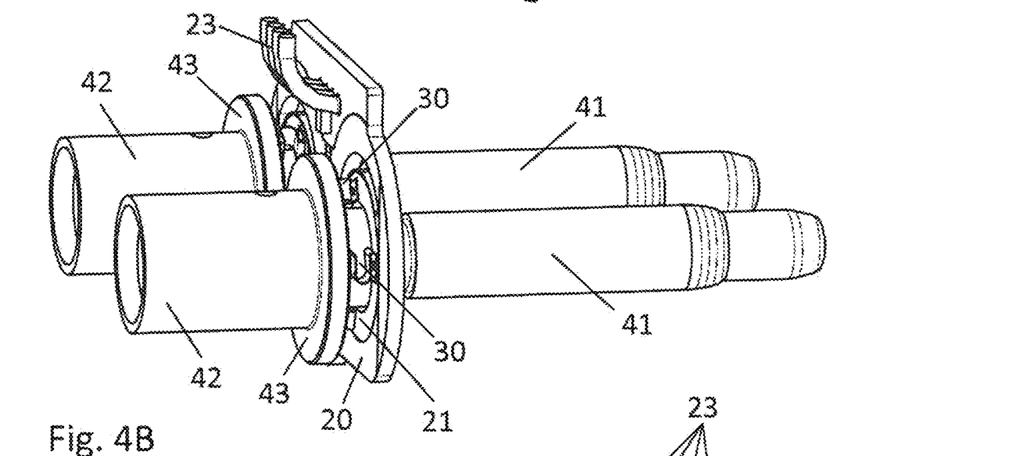
FIG. 4B: the system illustrated in FIG. 4A from a different perspective.

The charging plug 1 illustrated in the figures comprises two power contacts 40, which are designed for transmitting direct current. The power contacts 40 can be seen more clearly in FIGS. 4A and 4B. The power contacts 40 have a first connection region 41 for coupling to an energy receiver (e.g. a contact socket of an electric vehicle) and a second connection region 42, which can be electrically connected by means of a charging cable e.g. with a charging station (not illustrated in the figures). The first connection regions 41 of the power contacts 40 are in the form of contact pins 41.

Figure 2A:
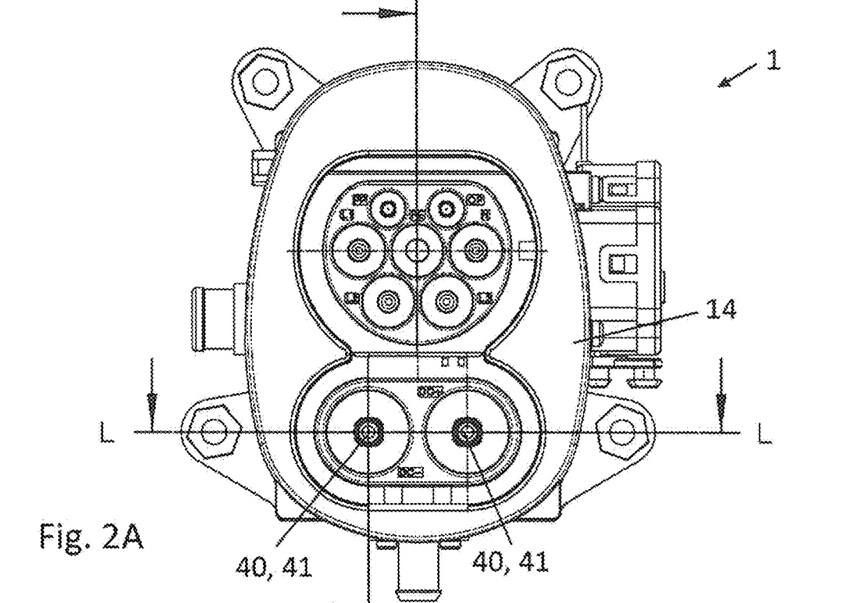
FIG. 2A: a top view of the connector face of the charging plug according to the invention.
Figures 2B, 2C:
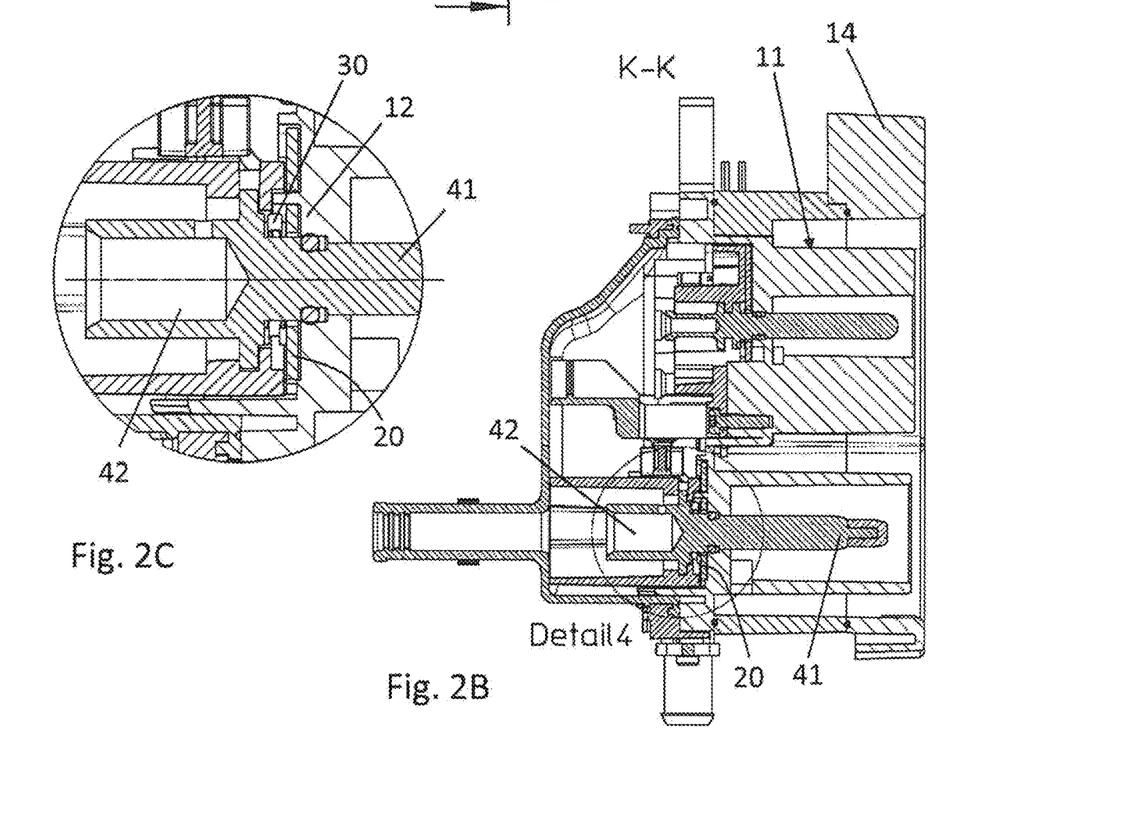
FIG. 2B: a cross-sectional illustration of the charging plug illustrated in FIG. 2A along the sectional plane K-K.
FIG. 2C: a detail view of the cross-sectional illustration shown in FIG. 2B.
Figure 3A:
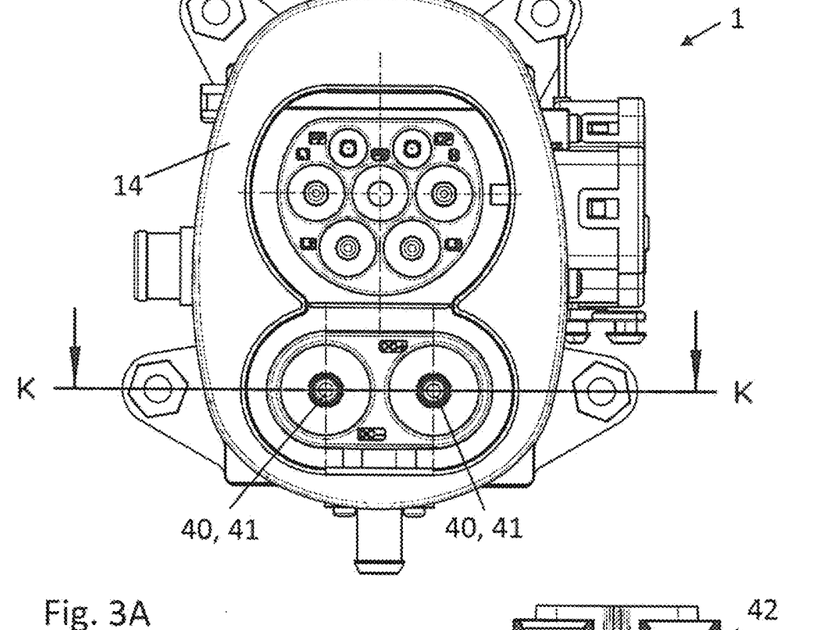
FIG. 3A: the connector face illustrated in FIG. 2A with a different sectional plane.
Figures 3B, 3C:
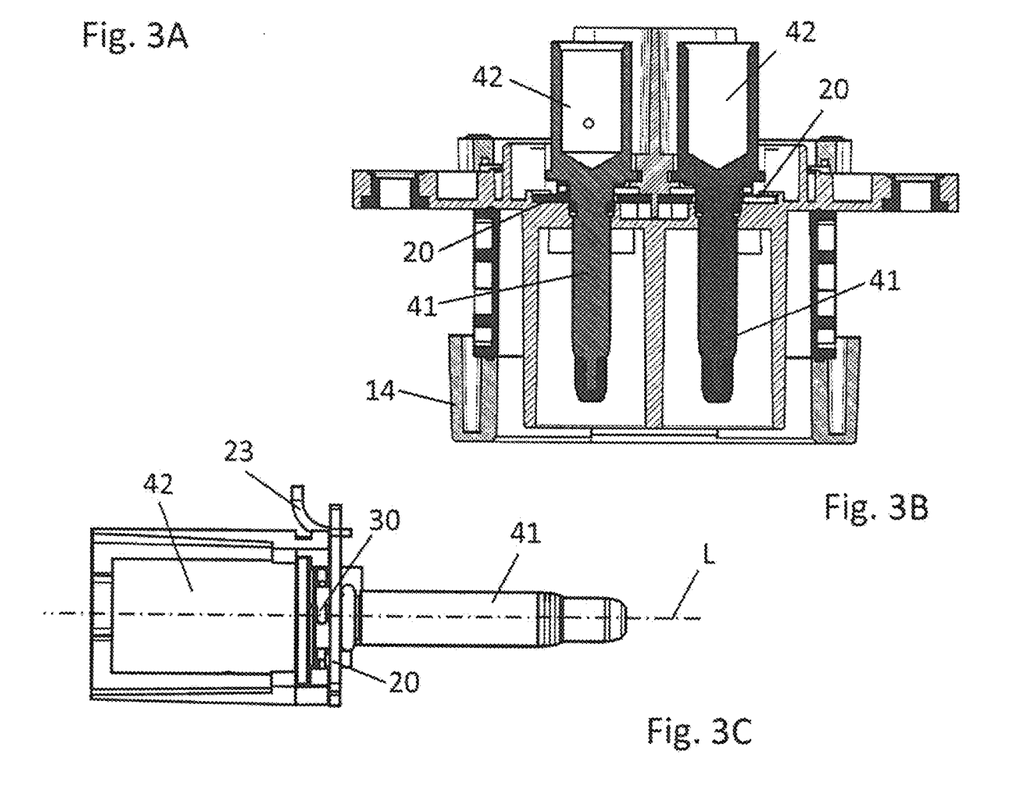
FIG. 3B: a cross-sectional view through the charging plug illustrated in FIG. 3A along the sectional plane K-K.
FIG. 3C: a power contact together with the printed circuit board of the charging plug according to the invention coupled thereto in a lateral cross-sectional illustration.

The charging plug 1 has a housing 10, which is in the form of a charging plug housing 10 in the exemplary embodiment illustrated. The charging plug housing 10 has a front region 11 and a back region 13 (see FIG. 2B). It can be seen from FIG. 2B that the front region 11 is configured to be connectable to the back region 13. It can furthermore be seen from the figures that a front cover 14 is provided on the front region 11. It can furthermore be seen from FIG. 2B that the power contacts 40 are connected by means of a securing flange 43 (see FIG. 4B) to the back region 13 of the housing 10.

The charging plug according to the invention furthermore comprises a printed circuit board 20 arranged in the housing 10, which is arranged between the power contacts 40 and a retaining section 12 of the housing 10 which is provided in the front region 11. In this case, the printed circuit board 20 is clamped between the power contact 40 and the retaining section 12 by means of multiple spring-force apparatuses 30 which are arranged between the power contacts 40 and the retaining section 12. More precisely, the spring-force apparatuses 30 are arranged between the securing flange 43 and the printed circuit board 20, so that the spring-force apparatuses 30 apply force to the printed circuit board 20 in the direction of the retaining section 12, as a result of which the printed circuit board 20, which is arranged in a floating manner, is clamped between the power contact and the retaining section 12.

Consequently, the printed circuit board 20 is thermally coupled and galvanically connected to the respective power contacts 40 by means of the spring-force apparatuses 30, since the spring-force apparatuses 30 are preferably made of a spring steel so that, when the securing flange 43 is contacted by means of the spring-force apparatuses 30, a galvanic connection is formed between the spring-force apparatuses 30 and the respective power contacts 40.

The spring-force apparatuses 30 here are in the form of surface-mounted spring-force apparatuses 30, which are also referred to as SMD spring-force apparatuses 30, and are soldered to contact surfaces 21 of the printed circuit board 20. Consequently, there is a galvanic connection between the respective power contacts 40 and the corresponding contact surfaces 21 of the printed circuit board 20.

Figure 4C:
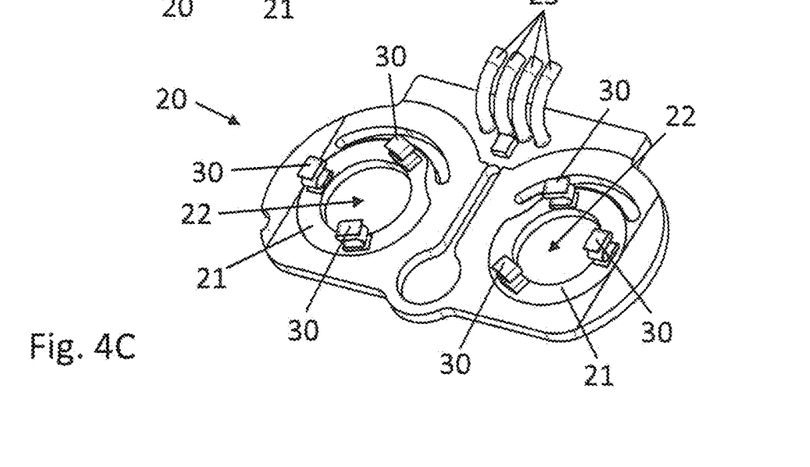
FIG. 4C: a perspective illustration of a printed circuit board of the charging plug according to the invention viewed alone.

In FIG. 4C illustrates the printed circuit board 20 in isolation. It can be seen that the printed circuit board 20 has two through holes 22, through which the respective first connection regions 41 of the power contacts 40 protrude. Consequently, a radial positioning of the printed circuit board 20 by means of the first connection region 41 of the power contacts 40 is ensured. The printed circuit board 20, as already mentioned above, has metallic contact surfaces 21, which surround the through holes 22 in each case. On each of the contact surfaces 21, three spring-force apparatuses 30 are arranged such that they are spaced apart in the circumferential direction and are soldered to the respective contact surfaces 21. In the exemplary embodiment illustrated, the spring-force apparatuses 30 are in the form of spring steel straps 30 with multiple bends. For supplying the printed circuit board 20 with electricity and for data exchange, the printed circuit board 20 has multiple electrical terminals 23.

Figure 5:
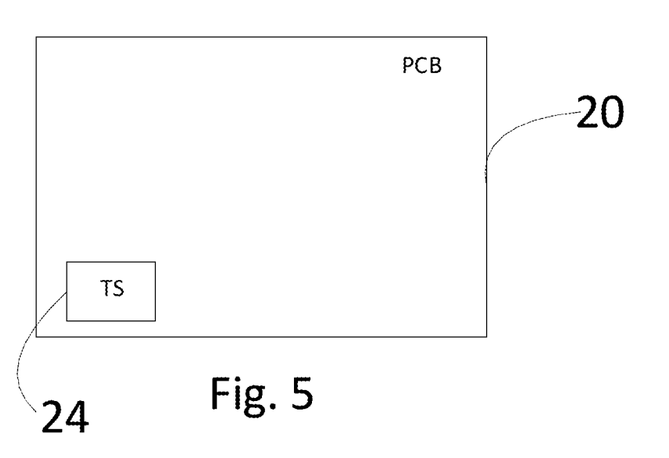
FIG. 5: a block diagram showing a temperature sensor is arranged on a printed circuit board of the electrical connection apparatus in the form of the charging plug of FIG. 1A.

As can be seen in FIG. 5, the printed circuit board 20 has a temperature sensor 24 by means of which the temperature of the power contacts 40 that are coupled to the printed circuit board 20 can be determined. Preferably, the printed circuit board 20 has a number of temperature sensors corresponding to the number of through holes 22 and thus to the number of power contacts 40, so that the temperature of each power contact 40 can be determined separately.

Furthermore, the printed circuit board 20 has a number of coding means corresponding to the number of through holes 22 and thus to the number of power contacts 40 installed in the charging plug 1, by means of which a resistance coding of the respective power contacts 40 is made possible. The coding means here are preferably in the form of ohmic resistors.

It can be seen from FIGS. 2B, 2C, 3B, 3C, 4A and 4B that a surface normal of the printed circuit board 20 is oriented substantially parallel to the respective longitudinal axes L of the power contacts 40.

LIST OF REFERENCE SIGNS

1 Electrical connection apparatus/charging plug
10 Housing/charging plug housing
11 Front region (of the housing)
12 Retaining section (of the housing)
13 Back region (of the housing)
20 Printed circuit board
21 Contact surface (of the printed circuit board)
22 Through hole (of the printed circuit board)
23 Electrical terminal (of the printed circuit board)
24 Temperature sensor
30 Spring-force apparatus/spring
40 Power contact
41 First connection region (of the power contact)
42 Second connection region (of the power contact)
43 Securing flange (of the power contact)
L Longitudinal axis (of the power contact)/plug-in direction of the charging plug

The invention claimed is:

1. An electrical connection apparatus for coupling to a corresponding connecting device and for transmitting electrical energy, wherein the electrical connection apparatus comprises
at least one power contact which is arranged in a housing of the electrical connection apparatus and is connected to said housing, and
at least one temperature sensor for determining a temperature of the power contact,
wherein:
the electrical connection apparatus further comprises a printed circuit board which is arranged in the housing of said electrical connection apparatus and is arranged between the power contact and a retaining section of the housing;
the printed circuit board is clamped between the power contact and the retaining section by means of a spring-force apparatus which is arranged between the power contact and the retaining section;
the printed circuit board is thermally coupled to the power contact directly or by means of the spring-force apparatus; and
the at least one temperature sensor is arranged on the printed circuit board.

2. The electrical connection apparatus according to claim 1, wherein the printed circuit board is electrically connected to the power contact directly or by means of the spring-force apparatus.

3. The electrical connection apparatus according to claim 1, wherein the printed circuit board comprises a contact surface which is in an electrically conductive form and which is electrically connected to the power contact directly or by means of the spring-force apparatus.

4. The electrical connection apparatus according to claim 3, wherein the spring-force apparatus is in the form of a surface-mounted spring-force apparatus and is soldered to the contact surface.

5. The electrical connection apparatus according to claim 3, wherein:
the printed circuit board comprises a through hole, through which the power contact protrudes; and
the contact surface of the printed circuit board surrounds the through hole thereof.

6. The electrical connection apparatus according to claim 1, wherein:
the spring-force apparatus is arranged between the power contact and the printed circuit board and is electrically connected to the power contact and the printed circuit board; and
the printed circuit board is clamped against the retaining section by means of the spring-force apparatus.

7. The electrical connection apparatus according to claim 1, wherein:
the power contact comprises a securing flange, by means of which the power contact is connected to the housing; and
the securing flange extends radially away from a longitudinal axis (L) of the power contact.

8. The electrical connection apparatus according to claim 7, wherein the spring-force apparatus is arranged between the securing flange and the retaining section of the housing.

9. The electrical connection apparatus according to claim 1, wherein the printed circuit board includes a plurality of power contacts having a cross-section associated with a maximum allowable current that can flow through each of the power contacts.

10. The electrical connection apparatus according to claim 1, wherein a surface normal of the printed circuit board is oriented substantially parallel to a longitudinal axis (L) of the power contact.

11. The electrical connection apparatus according to claim 1, wherein:
the housing comprises a front region and a back region that can be connected thereto;

the power contact is arranged in the back region and is connected thereto;

the retaining section of the housing is arranged in the front region; and the printed circuit board is arranged between the back region and the front region.

12. The electrical connection apparatus according to claim 1, wherein the temperature sensor is a temperature-dependent electrical resistor, in particular a thermistor.

13. A charging station for delivering electrical energy to a receiver of electrical energy, wherein the charging station comprises an electrical connection apparatus according to claim 1 in the form of a charging plug, which is electrically connected to the charging station by means of a supply cable.

14. The electrical connection apparatus according to claim 4, wherein:

the printed circuit board comprises a through hole, through which the power contact protrudes; and the contact surface of the printed circuit board surrounds the through hole thereof.

\* \* \* \* \*